US008821751B2

(12) United States Patent
Shi et al.

(10) Patent No.: US 8,821,751 B2
(45) Date of Patent: Sep. 2, 2014

(54) CHEMICAL MECHANICAL PLANARIZATION COMPOSITION AND METHOD WITH LOW CORROSIVENESS

(75) Inventors: Xiaobo Shi, Chandler, AZ (US); Ronald Martin Pearlstein, San Marcos, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 309 days.

(21) Appl. No.: 13/154,662

(22) Filed: Jun. 7, 2011

(65) Prior Publication Data

US 2012/0142191 A1 Jun. 7, 2012

Related U.S. Application Data

(60) Provisional application No. 61/358,309, filed on Jun. 24, 2010.

(51) Int. Cl.
| | |
|---|---|
| *C09K 13/02* | (2006.01) |
| *C09K 13/06* | (2006.01) |
| *C09K 13/08* | (2006.01) |
| *C09K 13/04* | (2006.01) |
| *C09K 13/00* | (2006.01) |
| *H01L 21/302* | (2006.01) |
| *H01L 21/461* | (2006.01) |
| *C03C 15/00* | (2006.01) |
| *C03C 25/68* | (2006.01) |

(52) U.S. Cl.
USPC ....... 252/79.1; 252/79.2; 252/79.3; 252/79.4; 252/79.5; 438/689; 438/745; 216/83; 216/89

(58) Field of Classification Search
None
See application file for complete search history.

(56) References Cited

U.S. PATENT DOCUMENTS

| | | | | |
|---|---|---|---|---|
| 5,954,997 | A * | 9/1999 | Kaufman et al. | 252/79.1 |
| 6,069,080 | A * | 5/2000 | James et al. | 438/691 |
| 7,691,287 | B2 | 4/2010 | Siddiqui et al. | |
| 7,915,071 | B2 | 3/2011 | Siddiqui et al. | |
| 2005/0056810 | A1* | 3/2005 | Bian et al. | 252/79.1 |
| 2006/0148391 | A1* | 7/2006 | Ono et al. | 451/526 |
| 2007/0075041 | A1* | 4/2007 | Ishibashi et al. | 216/88 |
| 2010/0075500 | A1 | 3/2010 | Yoshikawa et al. | |

FOREIGN PATENT DOCUMENTS

| | | |
|---|---|---|
| KR | 1994-0003574 | 4/1994 |
| KR | 2000-0057476 | 9/2000 |

* cited by examiner

*Primary Examiner* — Nadine Norton
*Assistant Examiner* — Stephanie Duclair
(74) *Attorney, Agent, or Firm* — Lina Yang

(57) ABSTRACT

A CMP composition and associated method are provided that afford good corrosion protection and low defectivity levels both during and subsequent to CMP processing. This composition and method are useful in CMP (chemical mechanical planarization) processing in semiconductor manufacture involving removal of metal(s) and/or barrier layer material(s) and especially for CMP processing in low technology node applications.

20 Claims, No Drawings

CHEMICAL MECHANICAL PLANARIZATION COMPOSITION AND METHOD WITH LOW CORROSIVENESS

CROSS REFERENCE TO RELATED APPLICATION

The present application claims the benefit of prior U.S. Provisional Patent Application Ser. No. 61/358,309 filed 24 Jun. 2010.

BACKGROUND OF THE INVENTION

This invention relates to chemical mechanical planarization (CMP, chemical mechanical polishing) for use in semiconductor manufacture. In particular, the invention relates to use of CMP in low (e.g., 22 nm) technology node applications.

CMP processing employing a barrier CMP slurry at stage 2 is often used to remove and planarize excess metal layers and other films on the surface of the patterned wafers to achieve global planarization.

When such CMP processing is utilized, a multi-step CMP process may be employed involving the initial removal and planarization of the copper overburden, referred to as a step 1 copper CMP process, followed by a barrier layer CMP process. The barrier layer CMP process is frequently referred to as a barrier or step 2 CMP process.

A specific featured distortion that is unsuitable for semiconductor manufacturing is the damage to copper vias or metal lines caused by the further corrosion of chemical components interacting with copper vias or metal lines in a chemical mechanical polishing process. Therefore, it is very important to identify and use suitable corrosion inhibitor(s) in a CMP slurry to reduce and control further corrosion of copper vias or trenches during and subsequent to chemical mechanical polishing processes.

In step 2 CMP processes, a barrier CMP slurry is used for the polishing process. The chemical reactions involved in using a barrier CMP slurry include: oxidation reactions induced by the oxidant used in the barrier CMP slurry, for example, $H_2O_2$. The surfaces of copper vias or trenches, and barrier material, such as Ta, are oxidized into the relative metal oxide films, typically, metal copper is oxidized into a mixture of cuprous and cupric oxides, and Ta is oxidized to $Ta_2O_5$ (the preferred oxide form for Ta). In most cases, chelators or ligands which can be chemically bonded to the copper cations and tantalum cations are used in barrier CMP slurry to accelerate the dissolution of copper oxide and tantalum oxide to yield the desirable removal rates of copper vias, trenches and barrier layer. Typically, abrasives are also used in most barrier CMP slurries; the abrasives with variable particle size provide mechanical friction forces between polishing pad and wafer surface under applied pressure.

In general, freshly polished copper vias or trenches will continue interacting with chemical components used in the CMP slurry to undergo further corrosion process. The further corroded copper vias or trenches will cause some defect issues for the subsequent integration of IC chips. Therefore, a corrosion inhibitor is used in the barrier CMP slurry to protect the copper vias or trenches during and after chemical mechanical polishing process from further corrosion. For example, BTA (1-H-1,2,3-benzotriazole) is widely known and used as a corrosion inhibitor in CMP slurries.

Ideally, a monolayer protection formed by the corrosion inhibitor used in a CMP slurry (e.g., barrier slurry) is preferred, but in fact, sometimes, BTA tends to form multilayer protective films on the surface of copper vias or trenches through coordination reactions. BTA also becomes less effective in corrosion inhibition when used in basic solutions. The commonly recognized passivation mechanism for BTA on the surface of polished copper vias or trenches involved the formation of a thin layer of polymeric $BTA\text{-}Cu^{n+}$ complexes or tetramer of $BTA\text{-}Cu^{n+}$ complexes.

Another drawback of BTA as a corrosion inhibitor is that the removal rates of copper vias or trenches generally will be undesirably reduced when the concentration of BTA is increased due to the formation of insoluble film of polymeric $BTA\text{-}Cu^{n+}$ complexes. Therefore, there is a significant need for finding new corrosion inhibitors that protect metal surfaces from corroding both during and after CMP processing but which do not have the above mentioned drawbacks that BTA and related corrosion inhibitors have. The present invention addresses this need by providing effective new corrosion inhibitors that do not have the drawbacks associated with BTA.

BRIEF SUMMARY OF THE INVENTION

Described herein is a chemical mechanical polishing slurry for the chemical-mechanical planarization ("CMP") of patterned substrate surfaces, such as, for example, patterned semiconductor wafers. More particularly, also described herein is a CMP polishing composition for polishing patterned wafers comprising multilayer films, such as barrier, low k or ultra Low k, dielectric, and metal vias or trenches. Such a chemical mechanical polishing composition is particularly effective for use in the second stage of chemical mechanical polishing of the patterned wafers and provides at least one of the following: affords a desirable removal rate of various types of film; affords a desirably low level of within a wafer non-uniformity ("WIW NU %"); results in low residue level(s) being present on the polished wafer(s) subsequent to CMP processing; and affords desirable selectivity among various films.

In an embodiment, the invention is a composition comprising:
  a) a compound selected from the group consisting of a cyanurate, an isocyanurate, and oxalic acid or salt thereof;
  b) an abrasive; and
  c) an oxidizing agent.
The cyanurate compound can be an isocyanurate.

In yet another embodiment, the invention is a method for chemical mechanical planarization of a surface having at least one feature thereon comprising a barrier layer material, said method comprising the steps of:
  A) placing a substrate having the surface having the at least one feature thereon comprising a barrier layer material in contact with a polishing pad;
  B) delivering a polishing composition comprising:
    a) a compound selected from the group consisting of a cyanurate, an isocyanurate, and oxalic acid or salt thereof;
    b) an abrasive; and
    c) an oxidizing agent;
  and
  C) polishing the substrate with the polishing composition.

In still yet another embodiment, the invention is a method for chemical mechanical planarization of a surface having at least one feature thereon comprising a metal, said method comprising the steps of:
  A) placing a substrate having the surface having the at least one feature thereon comprising a metal material in contact with a polishing pad;

B) delivering a polishing composition comprising:
  a) a compound selected from the group consisting of a cyanurate, an isocyanurate, and oxalic acid or salt thereof;
  b) an abrasive; and
  c) an oxidizing agent;
and
C) polishing the substrate with the polishing composition.

DETAILED DESCRIPTION OF THE INVENTION

In one embodiment, the invention is a composition comprising a) a cyanurate compound, which can be an isocyanurate compound, b) an abrasive, and c) an oxidizing agent.

The cyanurate compound and the isocyanurate compound can have the general structures as shown below:

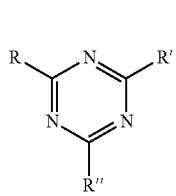 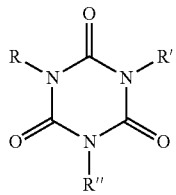

general structure of cyanurate    general structure of isocyanurate where R, R', and R" can have any of the following four relationships:
 1. R=R'=R"
 2. R=R' but not equal to R"
 3. R=R", but not equal to R'
 4. R not equal to R' and R", also R' not equal to R"

R, R', and R" can be any molecular moieties that contain any kind of functional groups which will allow them to form protective passivation layers on the surface of patterned wafers (typically on the surface of those metal vias or trenches, such as copper). Examples of moieties for R, R', and R" include the following: for example, —OH, straight or branched $C_1$-$C_8$ alkyl, and straight or branched $C_1$-$C_8$ alkylol. For example, R, R', and R" can each independently be hydroxyethyl, ethyl, or hydroxyl.

Additional examples for R, R', and R" follow:

In case 1, R=R'=R", the functional group can be alkyl alcohol with general structure —$C_nH_{2n}$—OH.

In case 2, R=R' but not equal to R", for R and R', the functional group can be alkyl alcohol with general structure —$C_nH_{2n}$—OH, for R", the functional group can be alkyl amine with general structure —$C_nH_{2n}$—$NH_2$ (or $R_2$).

In case 3, R=R" but not equal to R', for R and R", the functional group can be alkyl alcohol with general structure —$C_nH_{2n}$—OH, for R', the functional group can be alkyl carboxylate with general structure —$C_nH_{2n}$—COOR.

In case 4, R not equal to R' and R", also R' not equal to R", for R, the functional group can be alkyl alcohol with general structure —$C_nH_{2n}$—OH, for R', the functional group can be alkyl carboxylate with general structure —$C_nH_{2n}$—COOR, for R", the functional group can be alkyl amine with general structure —$C_nH_{2n}$—$NH_2$ (or $R_2$).

The cyanurate compound can be an isocyanurate. Suitable isocyanurates include, but are not limited to 1,3,5-tris(2-hydroxy-$C_1$-$C_4$-alkyl)isocyanurates, such as, for example, 1,3,5-tris(2-hydroxyethyl)isocyanurate. In a preferred embodiment, the isocyanurate is 1,3,5-tris(2-hydroxyethyl) isocyanurate.

In another embodiment, the invention is a composition comprising a) oxalic acid or a salt of oxalic acid, b) an abrasive, and c) an oxidizing agent. Suitable salts of oxalic acid include, but are not limited to, ammonium oxalate and potassium oxalate.

Suitable abrasives for this invention include, but are not limited to, alumina, ceria, germania, silica, titania, zirconia, and mixtures thereof. For example, colloidal silica is preferably used as an abrasive in the compositions disclosed herein. The colloidal silica can be made from sodium silicate, or it can be made from TEOS or TMOS. Various surface-modified abrasives can be utilized in this invention including those disclosed in U.S. Pat. Nos. 7,691,287 and 7,915,071.

Suitable oxidizing agents include, for example, one or more peroxy-compounds, which comprise at least one peroxy group (—O—O—). Suitable peroxy-compounds include, for example, peroxides (e.g., hydrogen peroxide), persulfates (e.g., monopersulfates and dipersulfates), percarbonates, and acids thereof, and salts thereof, and mixtures thereof. Other suitable oxidizing agents include, for example, oxidized halides (e.g., chlorates, bromates, iodates, perchlorates, perbromates, periodates, and acids thereof, and mixtures thereof, and the like), perboric acid, perborates, percarbonates, peroxyacids (e.g., peracetic acid, perbenzoic acid, m-chloroperbenzoic acid, salts thereof, mixtures thereof, and the like), permanganates, chromates, cerium compounds, ferricyanides (e.g., potassium ferricyanide), mixtures thereof, and the like. Some specific oxidizers that are useful in composition and method described herein include, but are not limited to, hydrogen peroxide, periodic acid, potassium iodate, potassium permanganate, ammonium persulfate, ammonium molybdate, ferric nitrate, nitric acid, potassium nitrate, ammonia, and other amine compounds, and mixtures thereof. Hydrogen peroxide and urea-hydrogen peroxide are preferred oxidizing agents.

The composition may further comprise a suitable compound that acts as a chelator or complexing agent. Various organic acids, organic amines, organic amino acid derivatives can be used as ligands or chelators to form complexes with copper cations or tantalum cations to enhance the metal oxide layer dissolution process. As one example, benzenesulfonic acid is a useful complexing agent.

A surfactant may be used in the composition as a surface wetting agent. Suitable surfactant compounds that may be added to the barrier CMP slurry as surface wetting agent include, for example, any of the numerous nonionic, anionic, cationic or amphoteric surfactants known to those skilled in the art.

The composition may further comprise a pH-adjusting agent to improve the stability of the polishing composition, tune the ionic strength of the polishing composition, and improve safety in handling and use of it. The pH-adjusting agent may be used to raise or lower the pH of the polishing composition. Suitable pH-adjusting agents to lower the pH of the polishing composition include, but are not limited to, hydrochloric acid, nitric acid, sulfuric acid, chloroacetic acid, tartaric acid, succinic acid, citric acid, malic acid, malonic acid, various fatty acids, various polycarboxylic acids and mixtures thereof. Suitable pH-adjusting agents to raise the pH of the polishing composition include, but are not limited to, potassium hydroxide, sodium hydroxide, ammonia, tetramethylammonium hydroxide, ethylenediamine, piperazine, polyethyleneimine, modified polyethyleneimine, and mixtures thereof.

The composition (and associated method) containing a novel corrosion inhibitor according to the invention possess the following functions: 1). This chemical additive, when used as a corrosion inhibitors in the composition, will effectively reduce further corrosion of copper metal line surfaces caused by continuous contact with chemical components in the used CMP slurry composition during and post-chemical mechanical polishing processes. 2). In general, the novel corrosion inhibitor used in the inventive composition contains coordination atoms which will allow such corrosion inhibitors to interact with freshly polished copper metal line surfaces to yield a thin protective layer on the surfaces of copper metal lines. The novel corrosion inhibitors can be considered as ligands to form coordinating bonds with copper cations on the surfaces of copper metal lines. 3). The novel corrosion inhibitors in the CMP slurry composition, when used in the reasonable concentration ranges, will not cause the large changes in the removal rates of various films which include copper vias or trenches, barrier layers such as Ta and TaN, Low k or ultra Low k films, dielectric films such as TEOS-derived silicon oxide compared with those removal rates obtained using the standard and reference barrier CMP slurry composition that contains BTA as corrosion inhibitor (a comparative case).

Method of Invention

The method of this invention entails use of the aforementioned composition (as disclosed supra) for chemical mechanical planarization of substrates comprised of a metal in one embodiment or a barrier layer material in another embodiment. In the method, a substrate (e.g., a wafer) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (slurry) is applied (usually continuously) on the pad during CMP processing to effect the removal of material to planarize the substrate.

For polishing of metals (e.g., tungsten and/or copper) in general, the pH of the slurry used according to the method can be either acidic, neutral, or basic. For polishing of barrier layer materials (e.g., tantalum and/or tantalum nitride), the pH of the slurry used according to the method is generally basic and can range from 7.1-12, 8-11, and 9-11 in different embodiments. In a preferred embodiment, the pH ranges from 9.5 to 11.8.

For barrier layer applications of this invention, choice of pH range for the inventive slurry is very important in tuning the removal rates of dielectric films, such as TEOS, low-k films, such as BD1, and barrier films, such as Ta/TaN, to have suitable values such that selectivity values are suitable to meet the particular requirements in a CMP polishing process of choice.

While not being bound by theory, the following explanation of pH effects is given. When the pH of the inventive slurry is less than 7.1, the removal rates of dielectric films and low-k films are too low due to sufficient hydroxyl anions not being present. At basic pH conditions, hydroxyl anions are present and these anions can react with TEOS or low-k films which can lead to higher levels of hydrolysis reactions occurring on the surface of the films and thereby affording needed removal rates being relatively high.

When pH values are selected between the ranges of 9.5-11.8, such hydrolysis reactions were enhanced, thus, lead to the increased removal rates of TEOS and low-k films.

The composition and method of this invention is particularly suited to CMP processing of barrier films, which include, but are not limited to, tantalum, tantalum nitride, titanium, and titanium nitride.

GLOSSARY

Polishing Pad Polishing pad, Fujibo H7000HN, was used during CMP, supplied by Narubeni America Corporation.
Parameters:
Å: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: polishing composition flow, ml/min
Removal Rates and Selectivity
Cu RR 2.0 psi Measured copper removal rate at 2.0 psi down pressure of the CMP tool
Ta RR 2.0 psi Measured tantalum removal rate at 2.0 psi down pressure of the CMP tool
Cu RR 2.0 psi Measured copper removal rate at 2.0 psi down pressure of the CMP tool
Ta RR 2.0 psi Measured tantalum removal rate at 2.0 psi down pressure of the CMP tool
Selectivity of Cu/BD/Ta/TEOS=Cu RR/BD RR/Ta RR/TEOS RR at same down force (psi)

EXAMPLES

General Experimental Procedure

All percentages are weight percentages unless otherwise indicated. In the examples presented below, CMP experiments were run using the procedures and experimental conditions given below. The CMP tool that was used in the examples is a Mirra®, manufactured by Applied Materials, 3050 Bowers Avenue, Santa Clara, Calif., 95054. A Fujibo H7000HN pad, supplied by Narubeni America Corporation, was used on the platen for the blanket wafer polishing studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by DuPont Air Products NanoMaterials L.L.C., at baseline conditions. Polishing experiments were conducted using electroplating deposited copper, Black Diamond (BD, low k dielectric), TEOS and tantalum wafers. These blanket wafers were purchased from Silicon Valley Microelectronics, 1150 Campbell Ave, CA, 95126, and Advantiv Corporation. The film thickness specifications are summarized below:
Copper: 10,000 Å electroplated copper/1,000 Å copper seed/ 250 Å Ta on silicon
Tantalum: 2,000 Å/5,000 Å thermal oxides on silicon
BD: BD1 10,000 Å
TEOS: 15,000 Å
Electrochemical measurements were made by using a Gamry Series G 300 Potentiostat/Galvanostat/ZRA. Data analysis was performed with the Gamry ECHEM ANALYST software suite. The working electrode was an 11 mm copper disk connected to Pine Instruments model AFASR adjustable speed rotator. A graphite rod was used as the counter electrode and potentials were referenced to a Ag/AgCl reference electrode positioned as close as possible to the working electrode. The copper disks were initially polished with diamond polish down to 1 µm and then with sub-micron colloidal silica. Final cleaning and deoxidization was performed immediately prior to each measurement by immersion in 29% citric acid solution for 5 minutes, followed by rinsing with deionized water. All experiments were performed in the ambient air, and no inerting was employed.

Electrochemical measurements commenced after allowing the static electrode to equilibrate with the experimental slurry formulation for 15 min. Tafel curves were obtained on equilibrated electrodes rotating at 500 rpm by sweeping the potential linearly at 10 mV/s from 25 mV cathodic of the equilibrium open circuit potential (OCP) to 25 mV anodic of the OCP. The corrosion current and corrosion potentials were extracted by using a fitting routine to the Butler-Volmer equation.

The X-ray Photoelectron Spectroscopy (XPS) experiments were performed on a PHI 5000 VersaProbe Spectrometer equipped with Multiple Channel Plates (MCD) and a focused Al monochromatic X-ray Source. The low resolution survey scan was performed at 117.4 eV Pass Energy, 1.000 eV step and 50 msec dwell time. The high resolution multiplex scans were performed at 23.50 eV Pass Energy, 0.100 eV Step and a 100 msec dwell time. The high resolution scans for the depth profile were conducted at 29.35 eV Pass Energy, 0.100 eV step and a 100 msec dwell time. The analysis area is 200 micron in diameter with a take-off angle of 45°. CASAXPS software was used to analyze the data using transmission function corrected Area Sensitivity Factors (ASF). The ion gun setting was 2 kV, 2 µA with a 4×4 mm raster in order to minimize sample damage from the sputtering process. The etch rate is calibrated against 18.7 nm $SiO_2$/Si from Sigma Optical Metrology Consulting. The sputtering rate was determined to be 1.7 nm·min$^{-1}$ on $SiO_2$. Since copper sputters 2.4 times faster than $SiO_2$, the actual sputter rate was assumed to be approximately 42 Å/min. A 0.12 minute sputter interval was used to obtain the desired 5 Å removal increment.

A base slurry for use in the examples was made up having the following composition:

| Component | Weight % |
|---|---|
| Potassium hydroxide | 1.3 |
| Benzene sulfonic acid | 1.3 |
| Colloidal silica | 6 |
| Hydrogen peroxide | 1 |

For each of 7 slurries as shown below, all components except hydrogen peroxide were initially mixed, the pH (before hydrogen peroxide addition) was measured, 1% hydrogen peroxide was then added, and then the pH (after hydrogen peroxide addition) was measured when equilibrium was attained. (Some slurries may take up to several hours to afford exhibit a stable pH value at equilibrium after addition of hydrogen peroxide).

Example 1

Comparative

Benzotriazole (BTA) was added at a level of 200 ppm to give a standard slurry for comparison to the slurries below. The pH of this standard slurry before $H_2O_2$ addition was approximately 11.2 and after $H_2O_2$ addition was approximately 10.65.

Example 2

Comparative

CDI4302d additive, a modified benzotriazole compound supplied by King Industries, Norwalk, Conn., was added at a level of 200 ppm to give a test slurry. The pH of this test slurry before $H_2O_2$ addition was approximately 11.1 and after $H_2O_2$ addition was approximately 10.60.

Example 3

Comparative 3,5-diamino-1,2,4-triazole was added at a level of 200 ppm to give a test slurry. The pH of this test slurry before $H_2O_2$ addition was approximately 10.9 and after $H_2O_2$ addition was approximately 10.45.

Example 4

Inventive 1,3,5-tris(2-hydroxyethyl)isocyanate was added at a level of 200 ppm to give a test slurry. The pH of this test slurry before $H_2O_2$ addition was approximately 11.3 and after $H_2O_2$ addition was approximately 10.75.

Example 5

Inventive

Potassium oxalate was added at a level of 200 ppm to give a test slurry. The pH of this test slurry before $H_2O_2$ addition was approximately 11.0 and after $H_2O_2$ addition was approximately 10.55.

Example 6

Inventive

Potassium oxalate was added at a level of 400 ppm to give a test slurry. The pH of this test slurry before $H_2O_2$ addition was approximately 11.2 and after $H_2O_2$ addition was approximately 10.60.

Example 7

Inventive 1,3,5-tris(2-hydroxyethyl)isocyanate was added at a level of 100 ppm to give a test slurry. Removal rates using this slurry were measured in the same manner as described herein for other examples as summarized in Table 2. The following removal rates were measured for this slurry: Ta: 488 Å/min; BD1: 1498 Å/min; Cu: 358 Å/min; and TEOS: 694 Å/min.

The pH of slurries 1-7 above ranged from about 10.4 to about 10.8 after addition of 1 weight % hydrogen peroxide.

The corrosion current and corrosion voltage of slurries 1-5 were then determined as specified above and afforded results that are summarized in Table 1.

TABLE 1

Corrosion Voltage & Corrosion Current of Slurries for Examples 1-5

| Inhibitor | $\Delta E_{corrosion}$ | Normalized Corr. Current ($I_{corr}$) | Comments |
|---|---|---|---|
| BTA (as control) (Example 1) | 0.0 mV | 1.00 | Control measured before, during & after measurements |
| CDI4302d (Example 2) | 9.1 mV | 0.98 | Similar to BTA (consistent with molecular structure of CDI4302d) |
| 3,5-diamino 1,2 4-triazole (Example 3) | 25.7 mV | 0.95 | Similar to BTA (a triazole derivative) |
| 1,3,5-tris(2-hydroxylethyl)isocyanurate (Example 4) | 6.0 mV | 0.80 | Good inhibitor |
| Potassium oxalate (Example 5) | 14.3 mV | 0.76 | Good inhibitor |

As shown in Table 1, the relative intensity of corrosion currents of the corrosion inhibitors tested is compared to that value obtained using BTA as corrosion inhibitor. Three different results were possible when comparing the corrosion current from BTA to those corrosion currents measured for different potential corrosion inhibitors. The first situation is that the tested potential corrosion inhibitor gave higher corrosion current in the basic pH solution than that obtained from the basic solution containing BTA. The second situation is that the tested potential corrosion inhibitor gave very similar corrosion current to that obtained from the basic solution containing BTA. The third situation is that the tested potential corrosion inhibitor gave lower corrosion current than that obtained from the basic solution containing BTA. The data in Table 1 showed the examples for some of those different observations. When the corrosion current of a basic solution containing a chemical additive is higher than the corrosion current obtained from BTA-containing basic solution, such a chemical additive is considered to have essentially no corrosion inhibition effect when used in the CMP slurry. When the corrosion current of a basic solution containing a chemical additive is very similar to the corrosion current obtained from BTA-containing basic solution, such a chemical additive is considered having similar corrosion inhibition effect with BTA when used in the CMP slurry. When the corrosion current of a basic solution containing a chemical additive is lower than the corrosion current obtained from BTA-containing basic solution, such a chemical additive is considered having a better corrosion inhibition effect than BTA when used in the CMP slurry.

Benzotriazole in Example 1 and related inhibitors (CDI4302d and 3,5-diamino-1,2,4-triazole) in Examples 2 and 3 all afforded relatively high corrosion current ($I_{corr}$) values. In sharp contrast, 1,3,5-tris(2-hydroxylethyl)isocyanurate in Example 4 and potassium oxalate in Example 5 both exhibited greatly reduced corrosion current ($I_{corr}$) values, which indicates as discussed supra that these two additives are much more effective corrosion inhibitors than benzotriazole and related compounds.

Based on electrochemical screening testing results, various chemical additives were tested as alternative corrosion inhibitors to BTA in a barrier CMP slurry used in polishing experiments to provide polished wafers that were then subjected to analysis. XPS depth profile analysis on the polished wafers was used to characterize the thickness of the protective layers formed by different corrosion inhibitors. XPS analysis was also used for the surface elemental analysis to confirm the existence of nitrogen, oxygen, and carbon. The existence of these three elements plus the sub-nm or nm protective layer in thickness on the surface of the polished wafers supported the conclusion that some of selected chemical additives can be used as alternative corrosion inhibitors in the disclosed barrier CMP slurries.

Polishing experiments were then run using the slurries of Examples 1-5 using the methodology given above. The results are summarized in Table 2.

TABLE 2

Polishing Removal Rates for Slurries of Examples 1, 4, 5, and 6.

| Films & Removal Rates (in Angstroms/minute) | Example 1 with BTA (200 ppm) (Control) | Example 5 with potassium oxalate (200 ppm) | Example 6 with potassium oxalate (400 ppm) | Example 4 with tris-(2-hydroxyethyl) isocyanurate (200 ppm) |
|---|---|---|---|---|
| Ta | 529 | 522 | 530 | 528 |
| BD1 | 1465 | 1339 | 1412 | 1432 |
| Cu | 345 | 262 | 266 | 274 |
| TEOS | 687 | 660 | 681 | 702 |

As shown in Table 2, the inventive chemical additives (different from BTA or triazole type corrosion inhibitors), when used in a CMP slurry in place of BTA, similar removal rates of Ta (tantalum), BD1 (Black Diamond 1), and TEOS (tetraethyl orthosilicate) were obtained, but the removal rates of Cu (copper) were decreased. Such removal rate decrease on polishing copper vias or trenches can be attributed to the stronger passivation protection effects from using these stronger and more effective corrosion inhibitors in these CMP slurries in comparison to that provided by BTA in the comparative slurry.

The invention claimed is:

1. A composition comprising:
   a) a compound selected from the group consisting of a cyanurate and an isocyanurate having general structures as:

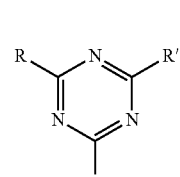 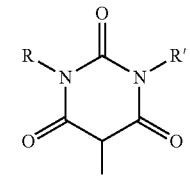

general structure of cyanurate    general structure of isocyanurate where R, R', and R" are independently selected from the group consisting of —OH, straight or branched $C_1$-$C_8$ alkyl, and straight or branched $C_1$-$C_8$ alkylol;
   b) an abrasive; and
   c) an oxidizing agent.

2. The composition of claim 1 further comprising a compound selected from the group consisting of a chelator and a complexing agent.

3. The composition of claim 1 further comprising a surfactant.

4. The composition of claim 1 wherein R, R', and R" are independently selected from the group consisting of hydroxyethyl, ethyl, and hydroxyl.

5. The composition of claim 4 wherein the compound is an isocyanurate.

6. The composition of claim 5 wherein the isocyanurate is 1,3,5-tris(2-hydroxy-$C_1$-$C_4$-alkyl)isocyanurate.

7. The composition of claim 6 wherein the 1,3,5-tris(2-hydroxy-$C_1$-$C_4$-alkyl)isocyanurate is 1,3,5-tris(2-hydroxyethyl)isocyanurate.

8. A method for chemical mechanical planarization of a surface having at least one feature thereon comprising a barrier layer material, said method comprising the steps of:
  A) placing a substrate having the surface having the at least one feature thereon comprising a barrier layer material in contact with a polishing pad;
  B) delivering a polishing composition comprising:
    a) a compound selected from the group consisting of a cyanurate and a isocyanurate having general structures as:

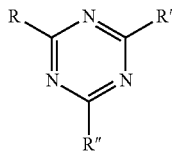 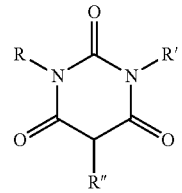

general structure of cyanurate     general structure of isocyanurate wherein R, R', and R' are independently selected from the group consisting of —OH, straight or branched C1-C8 alkyl, and straight or branched C1-C8 alkylol;
    b) an abrasive; and
    c) an oxidizing agent;
    and
  C) polishing the substrate with the polishing composition.

9. The method of claim 8 wherein the barrier layer material is selected from the group consisting of tantalum and tantalum nitride.

10. The method of claim 8 wherein the oxidizing agent is hydrogen peroxide.

11. The method of claim 8 wherein the pH of the polishing composition ranges from 7.1-12.

12. The method of claim 11 wherein the pH ranges from 9.5 to 11.8.

13. The method of claim 8 wherein the compound is an isocyanurate.

14. The method of claim 13 wherein the isocyanurate is 1,3,5-tris(2-hydroxy-$C_1$-$C_4$-alkyl)isocyanurate.

15. A method for chemical mechanical planarization of a surface having at least one feature thereon comprising a metal, said method comprising the steps of:
  A) placing a substrate having the surface having the at least one feature thereon comprising a metal material in contact with a polishing pad;
  B) delivering a polishing composition comprising:
    a) a compound selected from the group consisting of a cyanurate and a isocyanurate having general structures as:

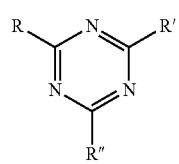 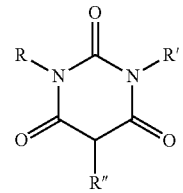

general structure of cyanurate     general structure of isocyanurate wherein R, R', and R' are independently selected from the group consisting of —OH, straight or branched C1-C8 alkyl, and straight or branched C1-C8 alkylol;
    b) an abrasive; and
    c) an oxidizing agent;
    and
  C) polishing the substrate with the polishing composition.

16. The method of claim 15 wherein the metal is selected from the group consisting of tantalum, copper, and tungsten.

17. The method of claim 15 wherein the oxidizing agent is hydrogen peroxide.

18. A composition comprising:
  a) an isocyanurate having a general structure as:

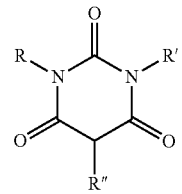

where R, R', and R" are independently selected from the group consisting of —OH, straight or branched $C_1$-$C_8$ alkyl, and straight or branched $C_1$-$C_8$ alkylol;
  b) an abrasive; and
  c) an oxidizing agent;
  wherein the pH of the composition ranges from 7.1-12.

19. The composition of claim 18 wherein the isocyanurate is 1,3,5-tris(2-hydroxy-$C_1$-$C_4$-alkyl)isocyanurate.

20. The composition of claim 19 wherein the 1,3,5-tris(2-hydroxy-$C_1$-$C_4$-alkyl)isocyanurate is 1,3,5-tris(2-hydroxyethyl)isocyanurate.

* * * * *